United States Patent [19]

Rudish

[11] Patent Number: 5,008,571
[45] Date of Patent: Apr. 16, 1991

[54] METHOD AND APPARATUS FOR DIVIDING HIGH FREQUENCY ANALOG SIGNALS

[75] Inventor: Ronald M. Rudish, Commack, N.Y.
[73] Assignee: AIL Systems, Inc., Deer Part, N.Y.
[21] Appl. No.: 373,894
[22] Filed: Jun. 29, 1989
[51] Int. Cl.$^5$ .......................... G06G 7/00; H03B 19/00
[52] U.S. Cl. .................................. 307/529; 307/271; 328/25; 331/51
[58] Field of Search ................... 307/529, 271; 328/25, 328/30; 331/51, 43, 42, 177 R; 333/218; 377/47

[56] References Cited

U.S. PATENT DOCUMENTS

| | | | |
|---|---|---|---|
| 2,888,557 | 5/1959 | Schneider | 331/51 |
| 2,926,244 | 2/1960 | Stryker, Jr. | 328/25 |
| 3,110,820 | 11/1963 | Panicello | 328/25 |
| 3,140,447 | 7/1964 | Olbrych et al. | 328/25 |
| 3,305,730 | 2/1967 | Parzen | 307/219.1 |
| 3,309,619 | 3/1967 | Schucht | 328/258 |
| 3,605,023 | 9/1971 | Kline, Jr. | 328/25 |
| 4,556,984 | 12/1985 | Genrich | 307/271 |
| 4,641,101 | 2/1987 | Selim | 328/25 |
| 4,670,674 | 6/1987 | Kantorowicz et al. | 328/25 |

OTHER PUBLICATIONS

*A Simple Frequency Divider Circuit*, in RF Design Magazine, Sep. 1986, pp. 76–78.
*Anadigics Product Highlights–ADV 3040*, Anadigics, Inc., The Frequency Halver Applications Bulletin, Telemus Electronic Systems.
*Regenerative Frequency Division With A GaAs FET*, IEEE Transactions on Microwave Theory and Techniques, vol. MTT-32, No. 11, Nov. 1984, pp. 1461–1468.
*Novel Design Approach For X-Band GaAs Monolithic Analog ½ Frequency Divider*, IEEE Transactions on Microwave Theory and Techniques, vol. MTT-34, No. 4, Apr. 1986, pp. 436–441.

Primary Examiner—Stanley D. Miller
Assistant Examiner—Richard Roseen
Attorney, Agent, or Firm—Hoffmann & Baron

[57] ABSTRACT

A frequency divider includes a power divider which receives an input signal and divides the input signal into first and second signals. A frequency doubler receives the first signal and provides a third signal having a frequency which is twice the frequency of the first signal. A hybrid junction sums the second and third signals and provides a fourth signal which corresponds to the sum of the second and third signals and which has a low frequency modulation component which is substantially equal to one-half the frequency of the input signal, as well as a high frequency carrier component. An envelope detector and a band-pass filter, connected in series, receive the fourth signal and provide an output signal corresponding to the low frequency component of the fourth signal, which low frequency component is substantially equal to one-half the frequency of the input signal.

6 Claims, 1 Drawing Sheet

METHOD AND APPARATUS FOR DIVIDING HIGH FREQUENCY ANALOG SIGNALS

BACKGROUND OF THE INVENTION

1. Field of the Invention

This invention relates to a method and apparatus for dividing analog signals, and more particularly relates to a method and apparatus for the binary frequency division of analog signals in the microwave/millimeter bands.

2. Description of the Prior Art

As is known, frequency divider circuits are used to reduce the frequency of a signal by an integral multiple of the original frequency of the signal. For example, a typical frequency divider circuit would take a signal of frequency f and divide it down by the integer two to a frequency f/2.

There are various types of frequency dividers which are well known in the art. For example, there is the regenerative type of divider, illustrated schematically by FIG. 1. A regenerative divider basically includes a mixer 2, an amplifier 4 and a feedback loop 6. The output frequency, $f_{out}$, goes around the loop and regenerates itself by combining with the input frequency, $f_{in}$. If it is assumed that $f_{out}=f_{in}/2$, then the two frequencies combine in the mixer to form $f_{in} \pm f_{out}$ or $f_{in}/2$ and 3 $f_{in}/2$. Thus, the output signal contains $f_{in}/2$ and its harmonics.

Although frequency division does occur in the regenerative divider described above, the divider has several shortcomings. The divider's output signal, $Sf_{out}$, may contain two or more closely spaced frequencies near $f_{in}/2$, rather than the desired signal at exactly $f_{in}/2$. These closely spaced frequencies may regenerate each other so that they are prominent in the output signal. Accordingly, a regenerative type of divider tends to be narrowband in its application in that it must be tuned to the specific frequency it is being operated at.

Another disadvantage of the regenerative divider is that it requires a feedback loop. This complicates the operation of the divider.

For low frequencies, a digital divider may be used. However, because such dividers use "dynamic" or active components, they are generally limited to relatively low frequency operation only. An example of a digital divider, which has one of the highest operating frequencies (i.e. 14 GHZ), is Part No. UPG507 manufactured by NEC.

Examples of various frequency divider circuits are described in U.S. Pat. Nos. 3,305,730 (Parzen); 3,309,619 (Schucht); 3,605,023 (Kline, Jr.); and 4,641,101 (Selim).

OBJECTS AND SUMMARY OF THE INVENTION

It is an object of the present invention to provide a method and apparatus for the binary frequency division of analog signals.

It is another object of the present invention to provide a method and apparatus for dividing high frequency analog signals.

It is a further object of the present invention to provide a frequency divider circuit which is simple in construction and relatively inexpensive to manufacture.

It is yet a further object of the present invention to provide a frequency divider which requires only "static" (i.e., non-active) components.

It is yet another object of the present invention to provide a frequency divider circuit which is relatively wideband.

It is still another object of the present invention to provide a method and apparatus for the frequency division of signals, which overcomes the disadvantages of known methods and apparatuses.

In accordance with one form of the present invention, a frequency divider, which is adapted to provide an output signal having a frequency which is substantially equal to one-half the frequency of a time varying input signal, includes a divider, such as a power splitter or coupler, which receives the input signal and divides the input signal into first an second signals.

The frequency divider further includes a frequency doubler which doubles the frequency of the first signal and provides a third signal on its output, which third signal has a frequency which is twice the frequency of the first signal.

A summing device, such as a hybrid junction, sums the second and third signals and provides a fourth signal on its output, which fourth signal corresponds to the sum of the second and third signals. The fourth signal has a low frequency component, which is substantially equal to one-half the frequency of the input signal, and a high frequency component.

The frequency divider further includes a circuit for separating the low frequency component of the fourth signal from the high frequency component. The separating circuit may include a rectifier demodulator or an envelope detector, and a band-pass filter. The separating circuit provides an output signal having a frequency which corresponds to the low frequency component of the fourth signal, which low frequency component is substantially equal to one-half the frequency of the input signal.

A method for the binary division of a time varying input signal, in accordance with the present invention, includes the steps of dividing the input signal into at least first and second signals, doubling the frequency of the first signal and providing a third signal which has a frequency which is twice the frequency of the first signal, summing the second and third signals and providing a fourth signal which corresponds to the sum of the second and third signals, and providing a fourth signal. The fourth signal corresponds to the sum of the second and third signals and has a low frequency component, which is substantially equal to one-half the frequency of the input signal, as well as a high frequency component.

The method further includes a step of separating the low frequency component of the fourth signal from the high frequency component, and providing an output signal corresponding to the low frequency component of the fourth signal. The low frequency component is substantially equal to one-half the frequency of the input signal.

These and other objects, features and advantages of this invention will be apparent from the following detailed description of illustrative embodiments thereof, which is to be read in connection with the accompanying drawings.

DETAILED DESCRIPTION OF THE PREFERRED EMBODIMENTS

Figure 1:
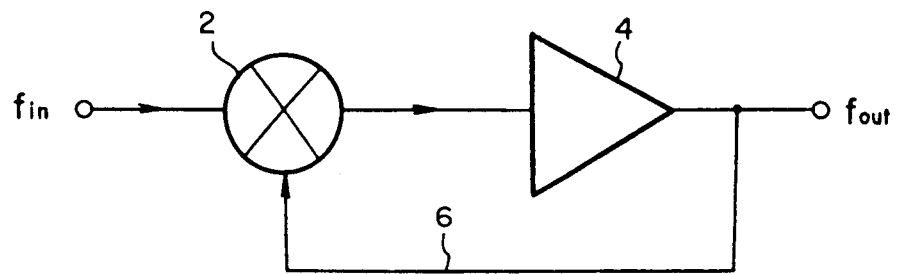
FIG. 1 is a schematic diagram of a conventional frequency divider circuit.
Figure 2:
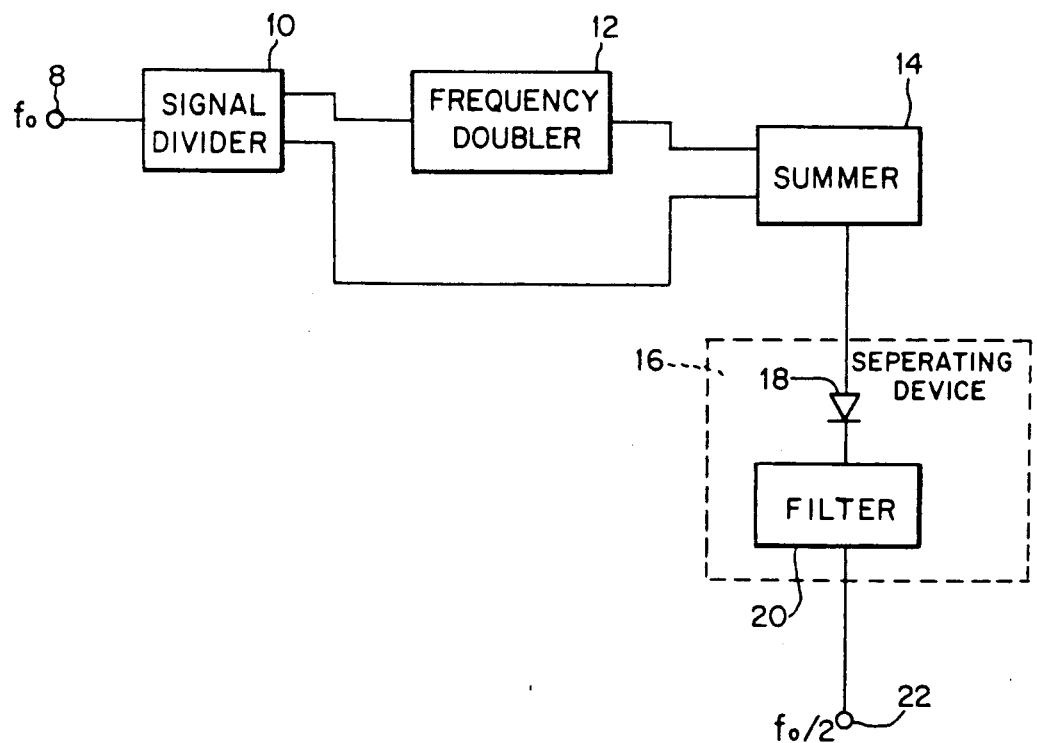
FIG. 2 is a schematic/block diagram of a frequency divider circuit, formed in accordance with the present invention.

Referring now to FIG. 2 of the drawings, it will be seen that a frequency divider circuit constructed in accordance with the present invention includes an input terminal 8 on which is received a time varying signal having a frequency, $f_0$. The time varying signal may be an analog signal and of high frequency, such as in the microwave/millimeter range, although the frequency divider of the present invention is perfectly adaptable for use with lower frequency signals.

The input 8 of the frequency divider circuit is connected to a signal divider 10 so that the time varying input signal is provided to the signal divider 10. The signal divider 10 may be a power splitter, coupler, hybrid, or any other similar device.

A typical 2-way power splitter or power divider includes three ports. One input port is for receiving the input signal, and two output ports provide the output signals from the divider. As is well known, a hybrid or coupler may be used as a divider, and may include four ports. The fourth port is unused and may be terminated using an appropriate termination. The signal divider 10 provides first and second signals on the two output ports, which signals are the power division of the time varying input signal.

One output port of the signal divider 10, such as the port that carries the first signal, is connected to a frequency doubler 12 so that the frequency doubler receives the first signal from the signal divider 10. As its name implies, the frequency doubler 12 will double the frequency of the first signal. The frequency doubler 12 has an output from which is provided a third signal having a frequency which is twice the frequency of the first signal.

The output of the frequency doubler 12 and the output of the signal divider 10 are connected to a summer 14, which may be a hybrid junction or other summing device. The summer 14 will sum the second and third signals, and has an output on which is provided a fourth signal. The fourth signal corresponds to the sum of the second and third signals, and exhibits amplitude modulation as the second and third signals alternately reinforce and interfere. More specifically, the fourth signal has a low frequency modulation envelope component which is substantially equal to one-half the frequency of the input signal, and a high frequency carrier component.

The output of the summer 14 is connected to the input of a modulation separating device 16. The modulation separating device 16 may include an envelope detector 18 and a band-pass filter 20 connected in series with the output of the envelope detector.

The modulation separating device 16 will separate the low frequency modulation component of the fourth signal from the high frequency carrier component. More specifically, the envelope detector 18 of the separating device will "strip off" the low frequency modulation component. The envelope detector 16 may be a rectifier demodulator or diode detector, as illustrated by FIG. 2.

The output of the envelope detector 16 is provided to a band-pass filter 20 or a low-pass filter. The band-pass filter 20 is preferably centered at one-half the frequency of the input signal, which is the frequency of the low frequency component of the fourth signal. A band-pass filter is preferably used to avoid any DC components, although a low-pass filter may suitably be used, the low-pass filter having its cutoff frequency just above the frequency of the low frequency component but well below the high frequency component.

The separating device 16, or more specifically, the bandpass filter 20 of the separating device, provides an output signal having a frequency which is one-half the frequency of the time varying input signal. The output signal is provided to an output terminal 22 of the frequency divider circuit.

The method of the present invention involves the process of implementing the trigonometric identity:

$$\cos A + \cos B = 2 \cos \tfrac{1}{2}(A+B) \cdot \cos \tfrac{1}{2}(A-B) \qquad \text{(Eq. 1)}$$

To facilitate an understanding of the invention, the magnitudes of the signals have been omitted.

If the time varying input signal is characterized as Cos wt, where w equals the frequency of the signal in radians, then the input signal is divided by the power divider into the first and second signal, each being Cos wt (without considering the magnitudes of the signals).

The first signal is provided to the frequency doubler 12. Accordingly, the third signal, which is the output signal of the frequency doubler, is in the form of Cos 2 wt.

Accordingly, the summer 14 will sum the third and second signals, that is, Cos 2 wt + Cos wt. This should be compared to the left side of the equal sign in Equation 1, where A would correspond to 2 wt and B would correspond to wt.

If 2 wt is substituted for A and wt is substituted for B in Equation 1, then Equation 1 may be rewritten as follows:

$$\cos 2wt + \cos wt = 2 \cos \tfrac{1}{2}(3wt) \cdot \cos \tfrac{1}{2}(wt) \qquad \text{(Eq. 2)}$$

The above equation would represent the fourth signal provided as the output signal from the summer 14.

It can be seen from the above that the fourth signal from the summer 14 includes a high frequency component, i.e., $\cos \tfrac{1}{2}(3wt)$, which may be viewed as a carrier frequency, and a low frequency component, i.e., $\cos \tfrac{1}{2} wt$, which may be thought of as the modulating frequency, which modulates the higher frequency carrier.

Accordingly, the low frequency component, i.e., $\cos \tfrac{1}{2} wt$, which has a frequency that is one-half the frequency of the input signal, is sought to be extracted. The two components of the fourth signal are merged as a product and as such cannot be separated by a filter. However, the low frequency component can be extracted by first demodulating and then filtering. This is done by the separating device 16. The envelope detector 1B which, as stated previously, may be a rectifier demodulator or diode detector, is treated as a square-law device, as is well known. The output of the envelope detector 18 is the sum of the modulation component and the carrier component and harmonics of both rather than a product of the components. Thus the modulation component at the output of the envelope detector can be extracted with a filter. Therefore, envelope detector 18 is connected to a band-pass filter 20 centered at ½ w, or a low-pass filter whose cut-off frequency is about ½ w, so that the low frequency component of the fourth signal may be separated from the high frequency carrier component. The low frequency component is substantially equal to one-half the frequency of the time varying input signal. Although a low-pass filter may be used, a band-pass filter is preferred to avoid any DC components.

The frequency divider of the present invention is perfectly suitable for operating at very high frequencies, on the order of 100 or 200 GHz, or even higher, such as in the terahertz range. It is also preferably formed from static or non-active components. Such components allow the frequency divider to operate at high frequencies.

The frequency divider of the present invention is also wideband. The high frequency component of the fourth signal provided by the summer is at least three times the frequency of the low frequency component. Accordingly, the bandpass filter may be fairly wideband and still be capable of rejecting the high frequency component.

Another advantage of the frequency divider of the present invention is its ability to be cascaded, or connected in series, with like frequency dividers The output signal from each of the cascaded frequency divider stages may be amplified and provided to the next frequency divider so that the cascaded arrangement of frequency dividers may divide the input signal by four, eight and so on, as required.

It is evident from the foregoing description that the frequency divider of the present invention is rather simple in construction and relatively inexpensive to manufacture or implement. No feedback loop is required, and only static components need be employed. The frequency divider operates at very high frequencies, and yet is relatively wideband.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A frequency divider, which comprises:
   means responsive to a time varying input signal for dividing the input signal into at least first and second signals, the signal dividing means including outputs from which the first and second signals are provided;
   means responsive to the first signal for doubling the frequency of the first signal, the frequency doubling means providing a third signal as an output signal having a frequency which is substantially twice the frequency of the first signal;
   means responsive to the second and third signals for summing the second and third signals, the summing means providing a fourth signal as an output signal which corresponds to the sum of the second and third signals, the fourth signal having a low frequency component which is substantially equal to one-half the frequency of the input signal, and a high frequency component; and
   means for separating the low frequency component of the fourth signal from the high frequency component, the separating means providing an output signal corresponding to the low frequency component of the fourth signal, which low frequency component is substantially equal to one-half the frequency of the input signal.

2. A frequency divider as defined by claim 1, wherein the input signal dividing means includes one of a power splitter, a power divider and a power coupler.

3. A frequency divider as defined by claim 1, wherein the summing means includes one of a hybrid junction and a power coupler.

4. A frequency divider as defined by claim 1, wherein the separating means includes an envelope detector and one of a bandpass filter and a lowpass filter connected to the envelope detector.

5. A method for the frequency division of a time varying input signal, which comprises the steps of:
   dividing the input signal into at least first and second signals;
   doubling the frequency of the first signal and providing a third signal having a frequency which is substantially twice the frequency of the first signal;
   summing the second and third signals and providing a fourth signal which corresponds to the sum of the second and third signals, the fourth signal having a low frequency component which is substantially equal to one-half the frequency of the input signal, and a high frequency component; and
   separating the low frequency component of the fourth signal from high frequency component and providing an output signal corresponding to the low frequency component of the fourth signal, which low frequency component is substantially equally to one-half the frequency of the input signal.

6. A method as defined by claim 5, wherein the step of separating the low frequency component from the high frequency component includes the step of envelope detecting the fourth signal and providing an output signal, and the step of filtering the output signal provided by envelope detection and providing a filtered output signal, wherein the filtered output signal corresponds to the low frequency component of the fourth signal, which low frequency component is substantially equal to one-half the frequency of the input signal.

* * * * *